US007928769B1

(12) United States Patent
Huang

(10) Patent No.: US 7,928,769 B1
(45) Date of Patent: Apr. 19, 2011

(54) LOGIC CIRCUITS WITH CURRENT CONTROL MECHANISMS

(75) Inventor: Kuo-Chung Huang, Ping-Chen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/731,555

(22) Filed: Mar. 25, 2010

(51) Int. Cl.
*H03K 19/096* (2006.01)

(52) U.S. Cl. .................. 326/95; 326/93; 326/98

(58) Field of Classification Search .............. 326/93–98; 327/142, 198, 543; 365/189.05, 203, 230.08
See application file for complete search history.

(56) References Cited

U.S. PATENT DOCUMENTS

| 6,888,377 | B2  |   | 5/2005  | Ngo |
|---|---|---|---|---|
| 7,202,704 | B2 | * | 4/2007  | Chu et al. ................. 326/98 |
| 7,256,621 | B2 | * | 8/2007  | Lih et al. .................. 326/121 |
| 7,298,177 | B1 | * | 11/2007 | Im et al. ................... 326/121 |
| 7,332,937 | B2 | * | 2/2008  | Hsu et al. ................... 326/95 |
| 7,336,105 | B2 |   | 2/2008  | Chuang et al. |
| 7,417,469 | B2 | * | 8/2008  | Cheng et al. ............... 326/112 |
| 7,471,114 | B2 | * | 12/2008 | Abadeer et al. .............. 326/95 |
| 7,804,330 | B2 | * | 9/2010  | Bhat et al. ................... 326/98 |
| 2004/0051561 | A1 | * | 3/2004 | Gauthier et al. .............. 326/98 |
| 2004/0051562 | A1 | * | 3/2004 | Gauthier et al. .............. 326/98 |
| 2007/0146013 | A1 | * | 6/2007 | Hsu et al. ................... 326/112 |

* cited by examiner

*Primary Examiner* — Vibol Tan
(74) *Attorney, Agent, or Firm* — Lowe Hauptman Ham & Berner, LLP

(57) ABSTRACT

Some embodiments regard a circuit comprising a current source network configured to generate a first current; a leakage circuit having a leakage current in at least two leakage conditions; the leakage currents affecting the flow of the first current; a current source generator configured to generate a similar first current corresponding to the first current, a similar first leakage current corresponding to a first leakage current in a first leakage condition, a similar second leakage current corresponding to a second leakage current in a second leakage condition; and a current control circuit configured to provide a current control signal controlling the first current based on the similar first current, the similar first leakage current, and the similar second leakage current.

20 Claims, 10 Drawing Sheets

US 7,928,769 B1

LOGIC CIRCUITS WITH CURRENT CONTROL MECHANISMS

FIELD

The present disclosure is generally related to integrated circuits, and, in various embodiments, is related to dynamic logic circuits with current control mechanisms.

BACKGROUND

Logic circuits are commonly used to provide control signals for memories (e.g., memory arrays). In some implementations, a logic circuit includes P-type Metal-Oxide Silicon (PMOS) transistors in the current keeper circuit (e.g., the current keeper) and N-type MOS (NMOS) transistors in the memory cells. In various situations, both the active current leakage and passive current leakage in the memory cells cause stress and/or failures to the PMOS transistors in the current keeper in different types of memory designs, including, for example, read-only memory (ROM), static random access memory (SRAM), etc. The variations in manufacturing process, voltage, and temperature (e.g., PVT variations) worsen the stress/failures. Process variations result in different driving capabilities of transistors causing a transistor to be slower or faster than another transistor, especially for different transistor types (e.g., P-type, N-type). Generally, the failures occur at low operation voltages (e.g., VCC) and when one type of transistor is slower than the other type. In one approach, when reading a "1" (e.g., a high, a high logic level), the stronger keeper current from the PMOS transistors disturbs the circuit's evaluation operation when the ratio I_active_leak/Ikeeper approaches 1 where I_active_leak is the leakage/flow when the circuit is in an active current leakage condition. In this situation, extending the pulse width of the corresponding word line (e.g., WL) does not cure the problem. For another example, reading a "0" (e.g., a low, a low logic level) fails when the ratio Ikeeper/I_passive_leak is small, where I_passive_leak is the leakage current when the circuit is in a passive current leakage condition. Some approaches, to cure the above problems, increase the size of the transistors forming the keeper current. This solution, however, increases the propagation delay from the input to the output of the current keeper causing slow access time (e.g., speed) and circuit operation variations. Some approaches add controls pins with user capabilities to select the appropriate pins to have the corresponding current flows and thus the appropriate keeper current, but also add complexity to the circuit.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
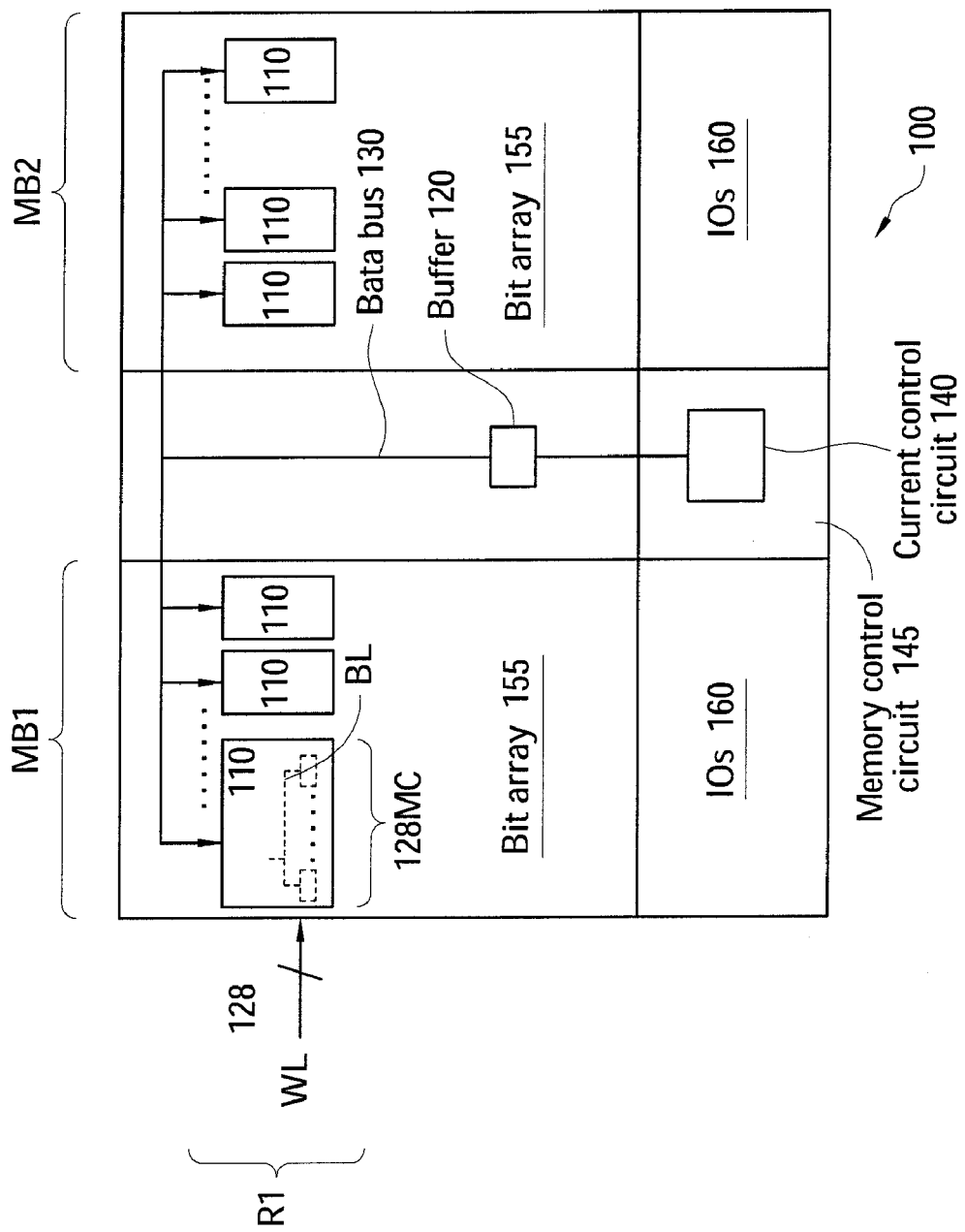
FIG. 1 is a schematic diagram of an exemplary memory array that uses some embodiments.

Embodiments, or examples, illustrated in the drawings are now being disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

The disclosed embodiments can have one or a combination of the following advantages. Some embodiments provide real-time tracking for the current keeper, including considering the process, voltage, and temperature (PVT) variations. Some embodiments include a control loop to generate the appropriate current. Some embodiments generate control signals in the same die with the memory array that use the embodiments. Some embodiments improve the unstabilities/failures due to both the active and passive leakage. Some embodiments use small size overhead.

Exemplary Circuit

FIG. 1 is a schematic diagram of a memory array 100 that uses some embodiments.

Memory array 100 includes a plurality of memory banks, but for illustration, two memory banks MB1 and MB2 are shown.

A memory bank (e.g., MB1, MB2) includes a bit array 155 that includes a plurality of memory cells MC arranged in rows (not shown) and columns (not shown) for storing data. In some embodiments, a dynamic logic circuit 110 includes a plurality of I (e.g., 128) memory cells MC. As a result, if K (e.g., 1280) is the number of columns in a memory bank, then there are 10 (=K/I=1280/128) logic circuits 110 in a row of a memory bank. If L (e.g., 1024) is the number of rows in a memory bank, then there are 10240 (=L*K/I=L×1280/128=1024×10) logic circuits 110 in a memory bank. For illustration, only one row R1 of logic circuits 110 is shown.

A bit line BL couples 128 memory cells MC in a logic circuit 110. For simplicity, only one bit line BL in one circuit 110 and 128 memory cells MC are shown. A word line WL controls (e.g., activates/deactivates) a memory cell MC. In the above example of 128 memory cells MC, there are 128 word lines WC controlling the corresponding 128 memory cells MC. In some embodiments, the same 128 word lines WL simultaneously control more than one string of 128 memory cells MC in the same row.

A buffer 120 refreshes signals between current control circuit 140 and logic circuits 110, e.g., when a logic circuit 110 is distant from current control circuit 140. In some embodiments, a buffer 120 is used for every 10-20 rows of memory cells MC. For simplicity, only one buffer 120 is shown.

Data bus 130 is means for transporting trim bits (control bits) tbcrtl (shown in FIG. 2) from current control circuit 140 to dynamic logic circuits 110.

Memory control circuit 145 provides the X-, Y-decode, clock, and other control signals to memory array 100. Current control circuit 140 of memory control circuit 145 provides circuitry for controlling the current flows in logic circuits 110. In some embodiments, a current control circuit 140 controls currents in all logic circuit 110 in memory array 100.

Inputs/Outputs (IOs) 160 are means for transferring data between memory cells MC and other circuitry.

Exemplary Block Diagram

Figure 2:
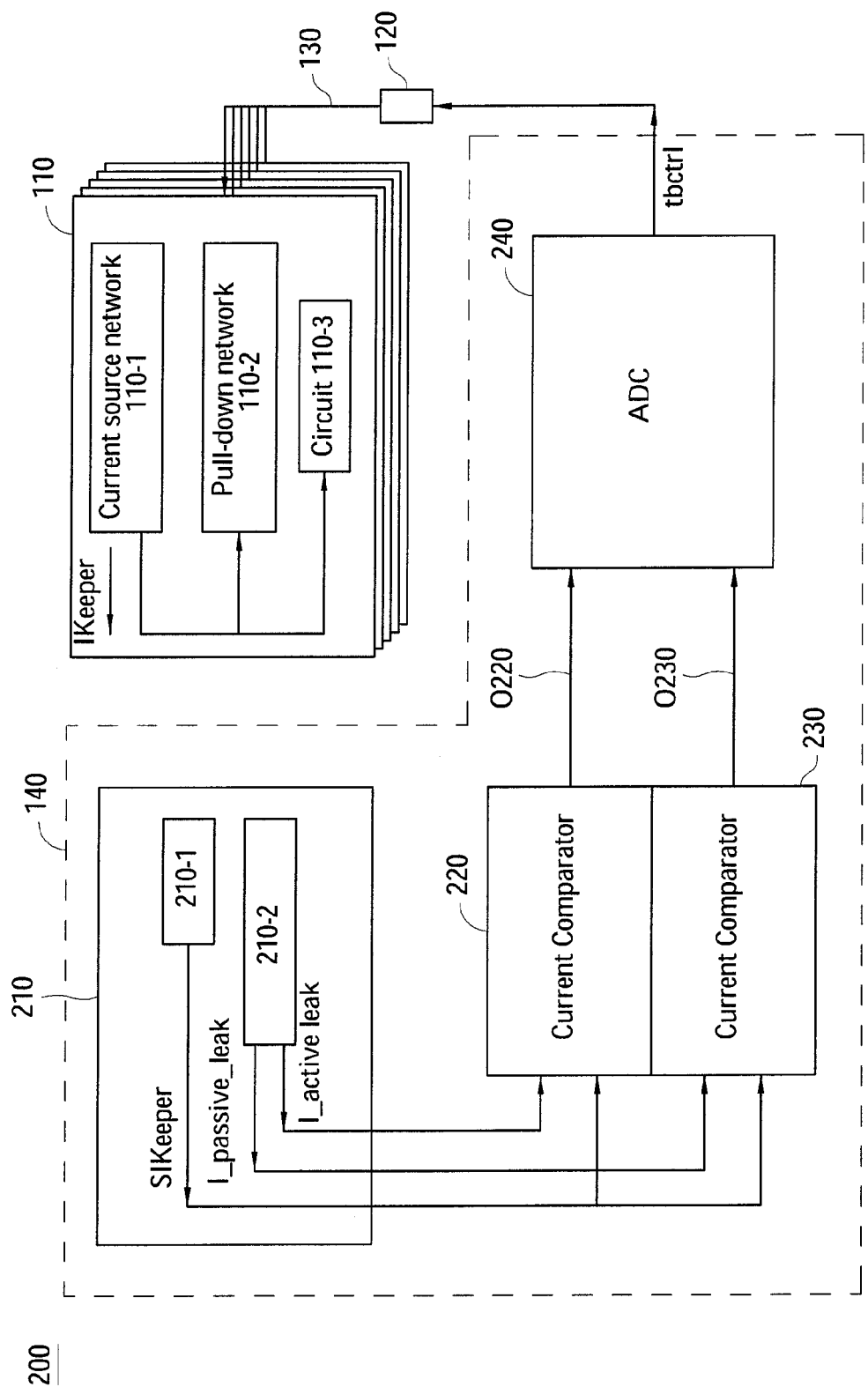
FIG. 2 is a functional block diagram illustrating controlling the keeper current in the logic circuit in the memory array of FIG. 1, in accordance with some embodiments.

FIG. 2 is a functional block diagram 200 illustrating how current control circuit 140 is used to control current flow (e.g., current Ikeeper) in a logic circuit 110, in accordance with some embodiments. Current source generator 210, current comparators 220 and 230, and ADC 240 of current control circuit 140, altogether control the amount of current (e.g., current flow) of current Ikeeper in logic circuits 110.

A dynamic logic circuit 110 includes a current source network 110-1 that provides current Ikeeper for circuit 110, and a pull-down network 110-2 that causes leakage current in circuit 110 and that affects the current flow of current Ikeeper. Pull-down network 110-2 can be called a leakage circuit 110-2. A circuit 110-3 includes functional circuitry for a logic circuit 110.

Current source generator 210 includes circuits 210-1 and 210-2 that generate similar currents in respective current source network 110-1 and in pull-down network 110-2. Circuit 210-1 generates current SIkeeper substantially equal to current Ikeeper. Circuit 210-2 generates current I_active_leak and I_passive_leak corresponding to the different leakage conditions (e.g., active leakage/passive leakage condition) of pull-down network 110-2.

Current comparator 220 compares current SIkeeper with current I_active_leak and provides signal O220 for use by ADC 240. Similarly, current comparator 230 compares current SIkeeper with current I_passive_leak and provides signal O230 for use by ADC 240.

Analog to Digital converter (ADC) receives signals O220 and O230 and generates control signal (e.g., trim bits) tbcrtl that control the current flow of current Ikeeper in logic circuits 110. Based on signals O220 and O230 that reflect the leakage current in pull-down network 110-2, if current SIkeeper is lower than a predetermined level (e.g., I_passive_leak), ADC 240 generates the corresponding control bits tbctrl to increase current Ikeeper, but if current SIkeeper is higher than a predetermined value (e.g., I_active_leak), ADC 240 generates the corresponding control bits tbctrl to decrease current Ikeeper. If current SIkeeper is within the range of currents I_passive_leak and I_active_leak (e.g., current SIkeeper is lower than current I_active_leak and higher than current I_passive_leak), current Ikeeper is kept unchanged. In effect, current Ikeeper is controlled (e.g., adjusted as appropriate) taking account of the leakage currents in pull-down network 110-2 that are constructed in current source generator 210.

In some embodiments, when memory array 100 is first turned on, circuits 210, 220, 230, and 240 are exercised to generate control bits tbcrtl that set the appropriate current provided to current Ikeeper.

The Dynamic Logic Circuit

Figure 3:
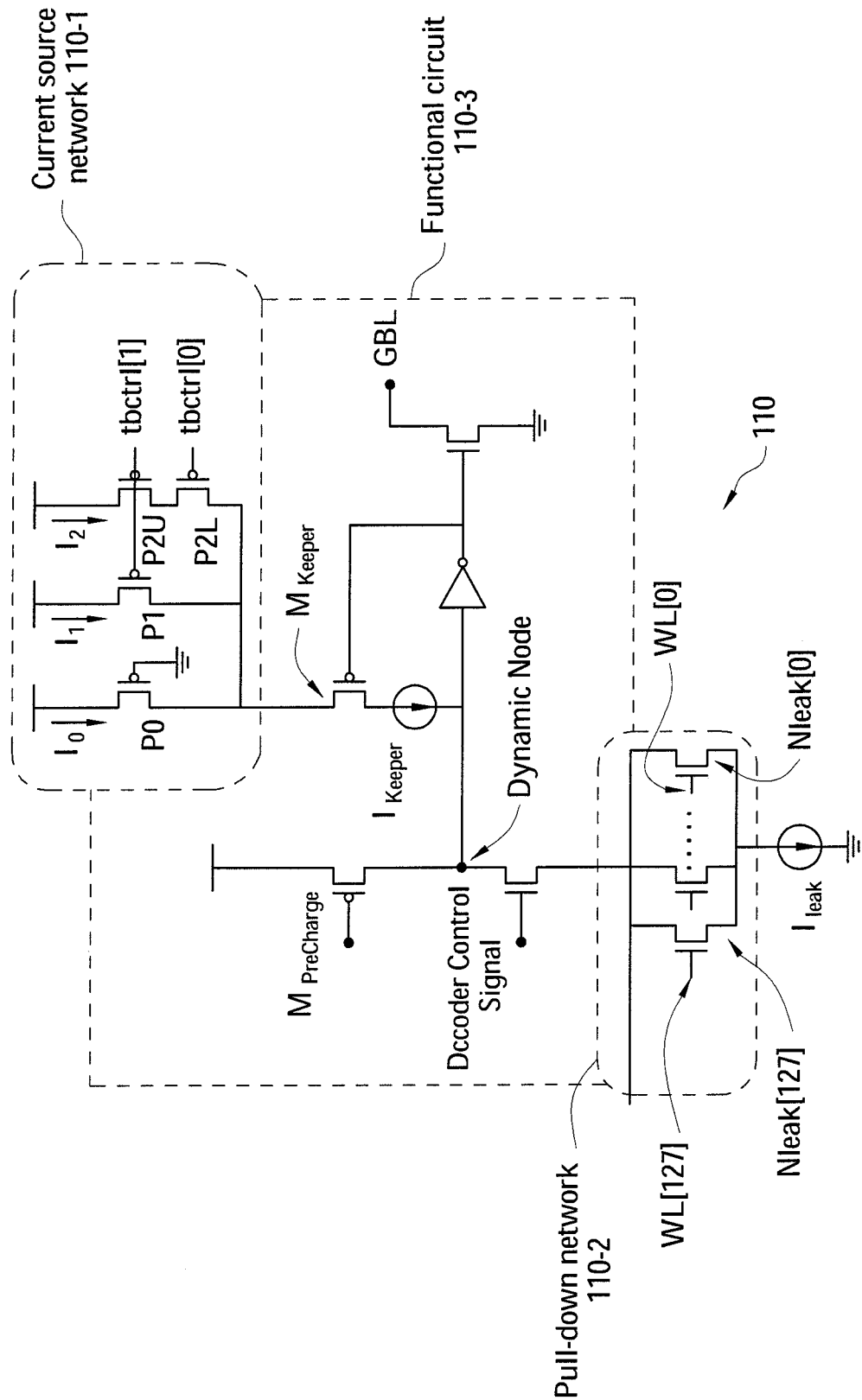
FIG. 3 is a schematic diagram of the dynamic logic circuit of FIG. 2, in accordance with some embodiments.

FIG. 3 is a detail schematic diagram of a logic circuit 110, in accordance with some embodiments.

In some embodiments, current source network (CSN) 110-1 includes three current sources I0, I1, and I2 that provide current Ikeeper to transistor Mkeeper. Because transistor Mkeeper demands sufficient current Ikeeper to function, but excessive or insufficient current Ikeeper causes stress and/or failures to transistor Mkeeper, some embodiments control current sources I0, I1, and I2 to provide appropriate current Ikeeper to transistor Mkeeper. Current Ikeeper is provided considering the PVT variations.

In some embodiments, current Ikeeper is default to current I0+I1 (e.g., flow flow1). If the default current Ikeeper is more than sufficient (e.g., current SIkeeper is greater than a predetermined value of current I_active_leak), current I1 is removed from the default flow1 to result in current I0 (e.g., flow2). But if current Ikeeper is insufficient (e.g., current SIkeeper is less than a predetermined value of current I_passive_leak), current I2 is added to flow1 to result in current I0+I1+I2 (e.g., flow3).

Two trim bits tbcrtl[1:0] together with transistors P0, P1, P2U, and P2L, control the current flows flow1, flow2, and flow3. Trim bit tbcrtl[1] controls (e.g., turn on/off) transistors P1 and P2U, while trim bit tbcrtl[0] controls transistor P2L. In some embodiments, the gate of transistor P0 is connected to ground. Consequently, in operation, transistor P0 is always on, and current I0 always flows. When trim bit tbcrtl[1] is low, transistor P1 is on. Current I1 flows. When both trim bits tbcrtl[1] and tbcrtl[0] are low, transistors P1, P2U, and P2L are on. Current I1 and I2 flow. As a result, the current flows flow1, flow2, and flow3 correspond to the two trim bits tbcrtl [1] and tbcrtl[0] as follows:

| tbcrtl[1:0] | Current Ikeeper |
| --- | --- |
| 01 | I0 (flow2) |
| 10 | I0 + I1 (flow1) |
| 11 | I0 + I1 + I2 (flow3). |

FIG. 3 showing two trim bits corresponding to three current flows is for illustration, different number of trim bits corresponding to different number of current flows can be used in different embodiments.

In some embodiments, pull-down network 110-2 includes 128 memory cells MC coupled to a bit line BL. An NMOS transistor forms a memory cell MC. For illustration, an NMOS transistor forming a memory cell MC is called a transistor Nleak because current leaks through this transistor. Pull-down network 110-2 is shown with 128 transistors Nleak (e.g., transistors Nleak[0] to Nleak[127]). Each gate of a transistor Nleak is coupled to a word line (e.g., WL). As a result, word lines WL[0] to WL[127] are coupled the gates of respective transistors Nleak[0] to Nleak[127]. Current Ileak represents the total leakage current for pull-down network 110-2. Pull-down network 110-2 can be called a leakage network, a leakage circuit, etc.

In some embodiments, the data stored in a transistor/memory cell Nleak is at a logic high (e.g., high) if the source of that transistor is low (e.g., grounded), and the data is low if the source is floating. Before reading a memory cell bit line BL is charged (pre-charged) to a high. The particular memory cell is selected for reading by driving a high at the gate of the transistor/memory cell.

Functional circuit 110-3, in addition to other functions, transfers the read data on bit line BL through the Dynamic Node to global bit line GBL. Circuit 110-3 can be called a current keeper, a current keeper circuit, etc., because circuit 110-3 provides and maintains current Ikeeper for logic circuit 110.

Illustrative Leakage Conditions

Figure 4:
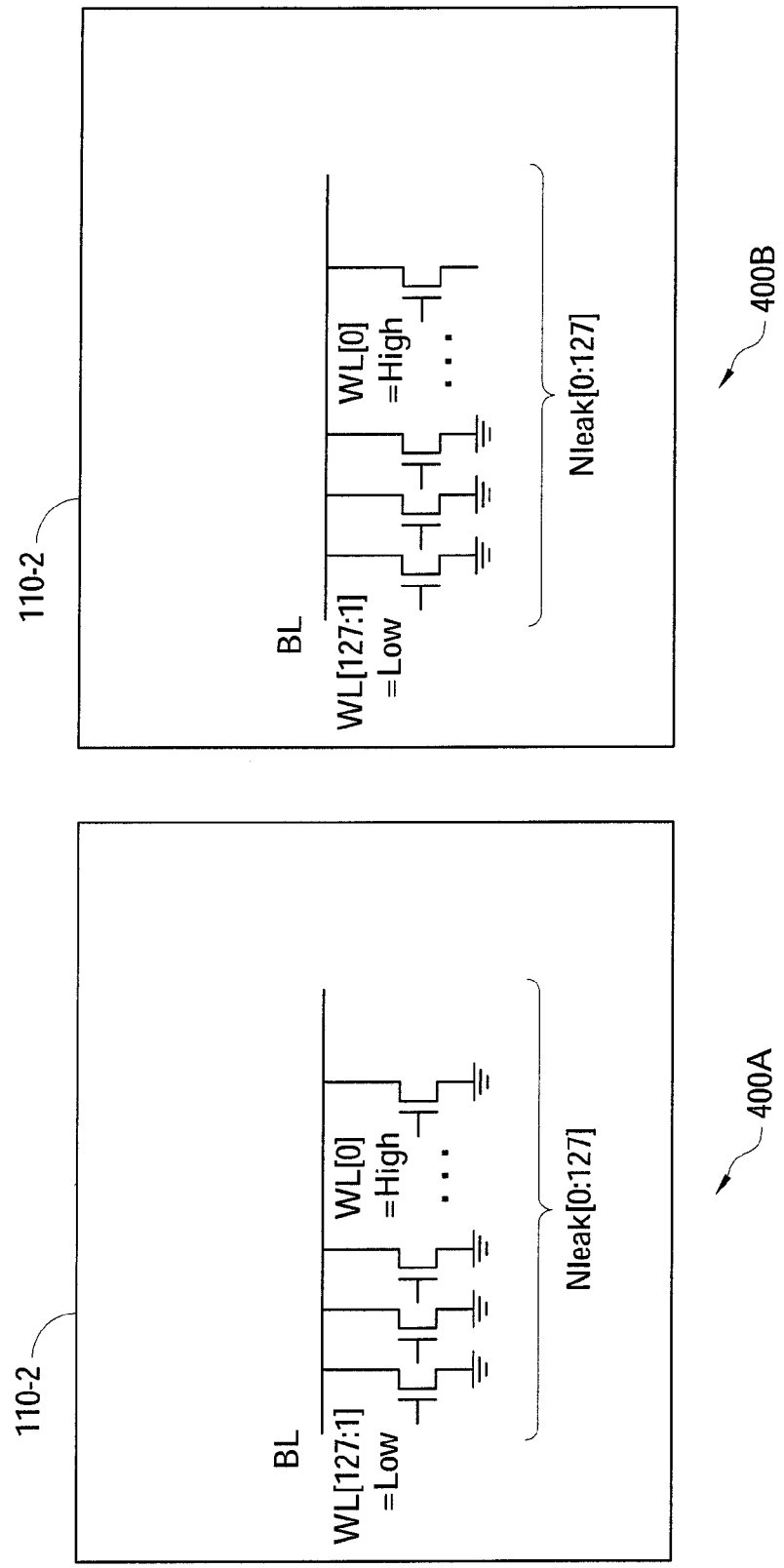
FIG. 4 is a schematic diagram of two circuits illustrating the active and passive leakage currents, in accordance with some embodiments.

FIG. 4 is a diagram of circuits 400A and 400B illustrating the leakage conditions of a pull-down network 110-2, in accordance with some embodiments.

Circuit 400A illustrates the "active" leakage condition in which a transistor/memory cell (e.g., Nleak[0]) being programmed "1" (e.g., high, logic high) is read, regardless of the program condition of the other transistors Nleak[1] to Nleak[127]. In this illustration, because transistors Nleak[1] to Nleak[127] are not read, their gates are driven low, and transistors Nleak[1] to Nleak[127] are off. Further, for illustration, all sources of transistors Nleak[1] to Nleak[127] are grounded (i.e., transistors Nleak[1] to Nleak[127] are all programmed high). Because transistor Nleak[0] is programmed high, the source of transistor Nleak[0] is grounded. Further, because the gate of transistor Nleak[0] is driven high for reading and the source of transistor Nleak[0] is grounded, transistor Nleak[0] turns on and is in the saturation mode. The current flowing from the drain to the source of transistor Nleak[0] (e.g., Icell_on) is relatively high compared to the current flow in transistors Nleak[1] to Nleak[127] that are off. In some embodiments, current Icell_on (not shown) is in the μA range while the current flowing through transistors Nleak[1] to Nleak[127] is in the nA range, which is insignificant compared to current Icell_on in the μA range. As a result, current I_active_leak is considered as the current of a transistor Nleak when the transistor Nleak is on and is in the saturation mode (e.g., Icell_on).

Circuit 400B illustrates the "passive" leakage condition in which a transistor/memory cell (e.g., Nleak[0]) being programmed "0" (e.g., low, logic low) is read. In this illustration, because transistors Nleak[1] to Nleak[127] are not read, their gates are driven low (e.g., WL[0] to WL[127] are low), and transistors Nleak[1] to Nleak[127] are off. For illustration, the sources of transistors Nleak[1] to Nleak[127] are grounded indicating that transistors Nleak[1] to Nleak[127] are programmed high. Because transistor Nleak[0] is programmed low, the source of transistor Nleak[0] is floating. Because the source of transistor Nleak[0] is floating, the current flowing from the drain to the source of transistor Nleak[0] is relatively low compared to the current leaked through 127 transistors Nleak[1] to Nleak[127]. As a result, in some embodiments, current I_passive_leak is considered the total leakage current of 127 transistors Nleak when these 127 transistors Nleak are off (e.g., 127*Icell_off where Icell_off is the leakage current when a transistor Nleak is off).

In some embodiments, the ratio Ikeeper/Ileak is considered, taking into account PVT variations. Because current Ikpeer is formed by PMOS transistor(s), and current Ileak results from NMOS transistor(s), and the transistor parameters betaP and betaN vary with respect to PVT, the ratio betaP/betaN is considered in determining the ratio Ikeeper/Ileak, wherein $$betaN = \frac{1}{2} \mu_N C_{ox} W/L$$

$$betaP = \frac{1}{2} \mu_P C_{ox} W/L$$

$\mu_N$ and $\mu_P$ are the respective mobility of electrons and holes.
$C_{ox}$ is the gate capacitance of a transistor per unit area
W/L is the ratio of the width over the length of the transistor.

In some embodiments, to provide for design margins, current Ikeeper is set as follows:

$$I\_active\_leak/Ikeeper > N1 \text{ or}$$

$$Icell\_on/Ikeeper > N1 \text{ and}$$

$$Ikeeper/(Icell\_off * 127) > N2 \text{ or}$$

$$Ikeeper/I\_passive\ leak > N2$$

where
N1=betaN/betaP when the transistor Nleak is on, and
N2=betaP/betaN when the transistor Nleak is off.
N1 and N2 can be called design margin factors.
Mathematically:

$$127 * N2 * Icell\_off < Ikeeper < Icell\_on/N1 \text{ or}$$

$$Ikeeper/Icell\_off > 127 * N2 \text{ and}$$

$$Ikeeper/I\_cell\_on < 1/N1$$

Because the ratio betaP/betaN varies with respect to PVT variations, the design margin factors N1 and N2 are selected considering the ratio betaP/betaN, the ratio Ikeeper/Ileak (Ikeeper/I_active_leak or Ikeeper/I_passive_leak) takes into account PVT variations. In some embodiments, the design margin factor N2 is 5 and the design margin factor N1 is 1.5, which are the design margin base lines for N2 (N2B) and N1 (N1B), respectively. Those skilled in the art will recognize that the design margin base lines differ for different technologies (e.g., manufacturing processes).

In some embodiments, currents I_active_leak and I_passive_leak are selected based on simulation of corresponding circuits considering various factors including, for example, the design (e.g., size) of the corresponding transistor Nleak, the PVT variations in manufacturing the transistors, etc.

The Current Source Generator

Figure 5:
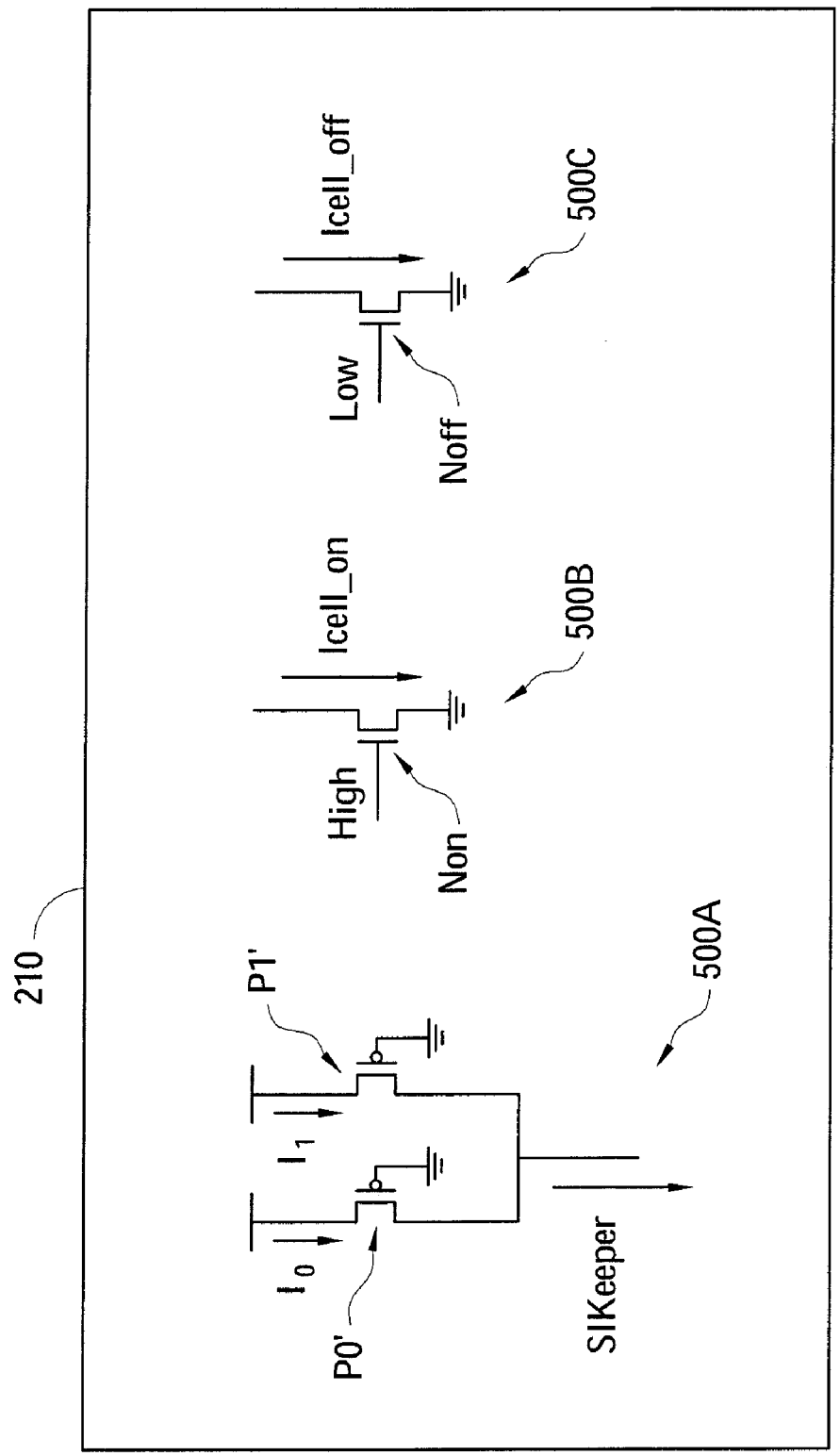
FIG. 5 is a detailed schematic diagram of the current source generator in FIG. 2, in accordance with some embodiments.

FIG. 5 is a schematic diagram of a current source generator 210, in accordance with some embodiments. Current source generator 210 includes circuits 500A, 500B, and 500C.

Circuit 500A generates current SIkeeper substantially the same as current Ikeeper. In some embodiments, because current Ikeeper is default to current I0 plus current I1 (e.g., I0+I1), current SIkeeper is substantially the same as current I0+current I1. Further, circuit 500A includes transistors P0' and P1' compatible to (e.g., having substantially the same size, same characteristic, same driving capabilities with) transistors P0 and P1 that generate current I0+I1. Transistors P0' and P1' are configured substantially the same as the corresponding transistors P0 and P1, i.e., their sources are coupled together like the sources of transistors P0 and P1. Circuit 500A is shown for illustration, other circuits generating a current SIkeeper substantially equal to current Ikeeper are with the scope of the disclosed embodiments. For example, a single transistor (e.g., transistor P01, not shown) having a size bigger than that of transistor P0 and/or P1 can be used to generate current I0+I1. Once current SIkeeper is generated, current SIkeeper is used by comparators 220 and 230 as appropriate. In some embodiments, two current mirrors (not shown) mirror current SIkeeper to comparators 220 and 230.

Circuits 500B and 500C each include a respective transistor Non and Noff that generate the respective current Icell_on and I_cell_off. In some embodiments, each transistor Non and Noff is substantially the same as a transistor Nleak. To generate current Icell_on the gate of transistor Non in FIG. 500B is driven high, and to generate current Icell_off the gate of transistor Noff is driven low. In some embodiments, current I_active_leak is current Icell_on while current I_passive_leak=127*Icell_off. Once currents I_active_leak and I_passive_leak are generated they are used by the respective comparators 220 and 230. In some embodiments, two current mirrors (not shown) mirror currents I_active_leak and I_passive_leak to respective comparators 220 and 230.

The Current Comparator Circuits

Figure 6:
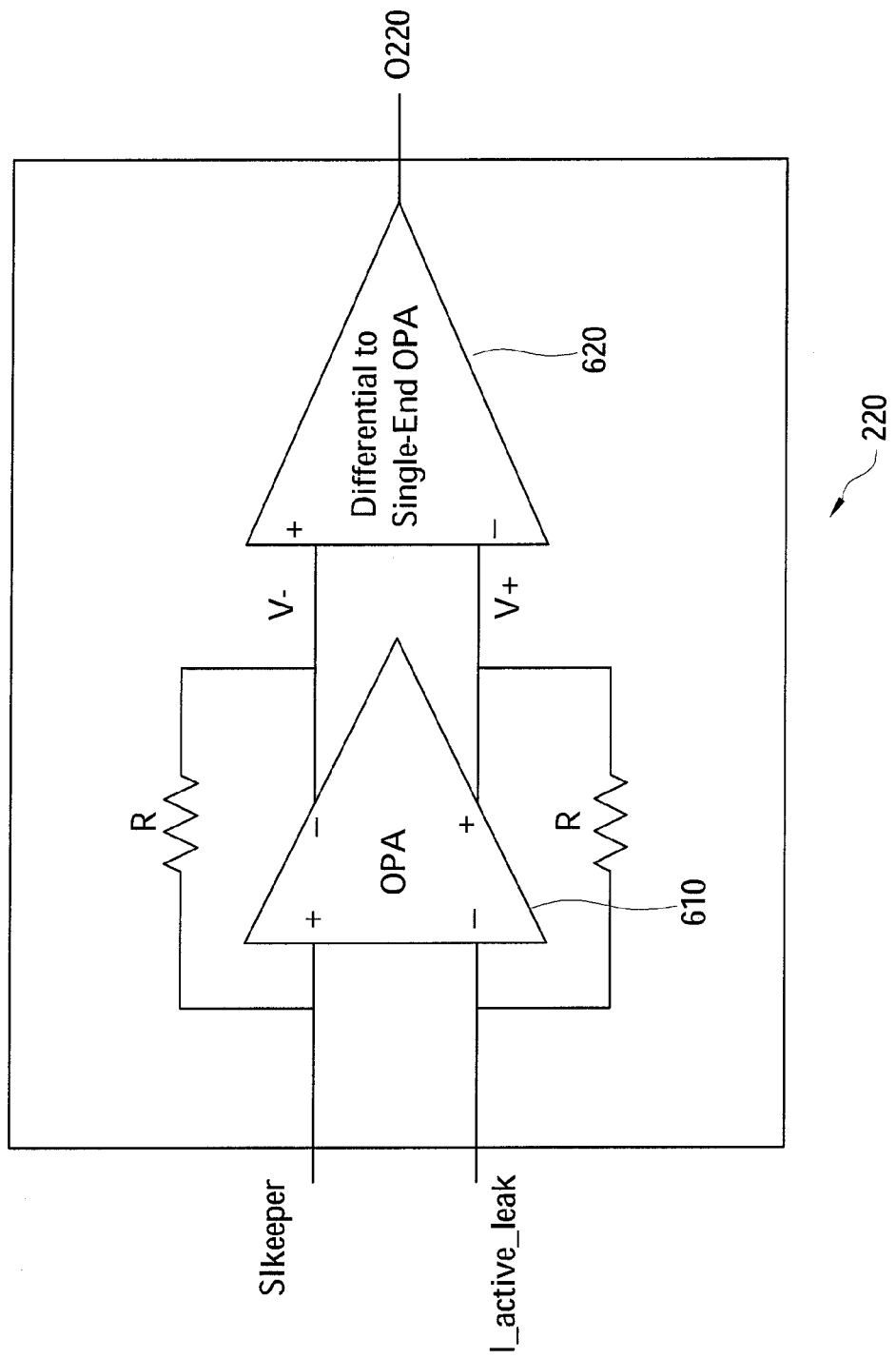
FIG. 6 is a schematic diagram of a current comparator in FIG. 2, in accordance with some embodiments.

FIG. 6 is a schematic diagram 600 of current comparator 220, in accordance with some embodiments.

Operational amplifier 610 (OPA) compares current SIkeeper with current I_active_leak (or Icell_on) and provides signals V+ and V−, wherein $V+ = SIkeeper*R$ and $V− = I\_active\_leak*R$ As a result, $(V+ − V−) = (SIkeeper − I\_active\_leak)*R.$ Differential-to-single-ended OPA 620 receives signal V+ and V− and generates signal O220 wherein $O220 = V+ − V− = (SIkeeper − I\_active\_leak)*R.$ Stated differently, OPA 620 converts the differential signals V+ and V− to a single ended signal O220.

In some embodiments, comparator 230 is implemented the same way as comparator 220 (or comparator 600), except that comparator 220 is used to compare current SIkeeper with current I_active_leak while comparator 230 is used to compare current SIkeeper with current I_passive_leak. Comparator 230 compares current SIkeeper with current I_passive_leak and generates signal O230 in the same manner a comparator 220 generates signal O220. Both signals O220 and 0230 are inputs for ADC 240. Current comparator 220 (and 230) can be called an operational transresistance amplifier.

The ADC Circuit

Figure 7:
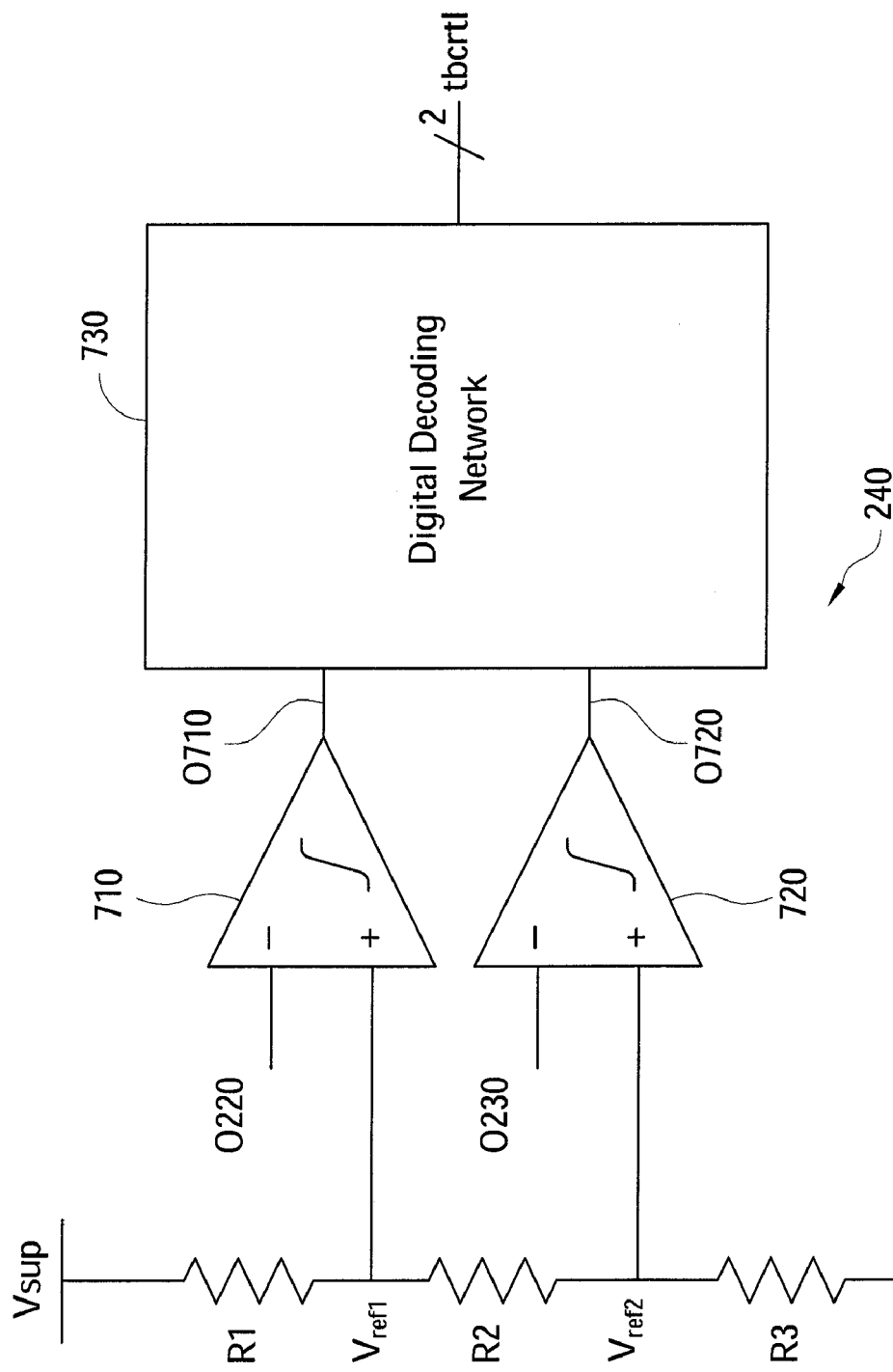
FIG. 7 is a schematic diagram of the ADC in FIG. 2, in accordance with some embodiments.

FIG. 7 is a schematic diagram of ADC circuit 240, in accordance with some embodiments.

Figure 8:
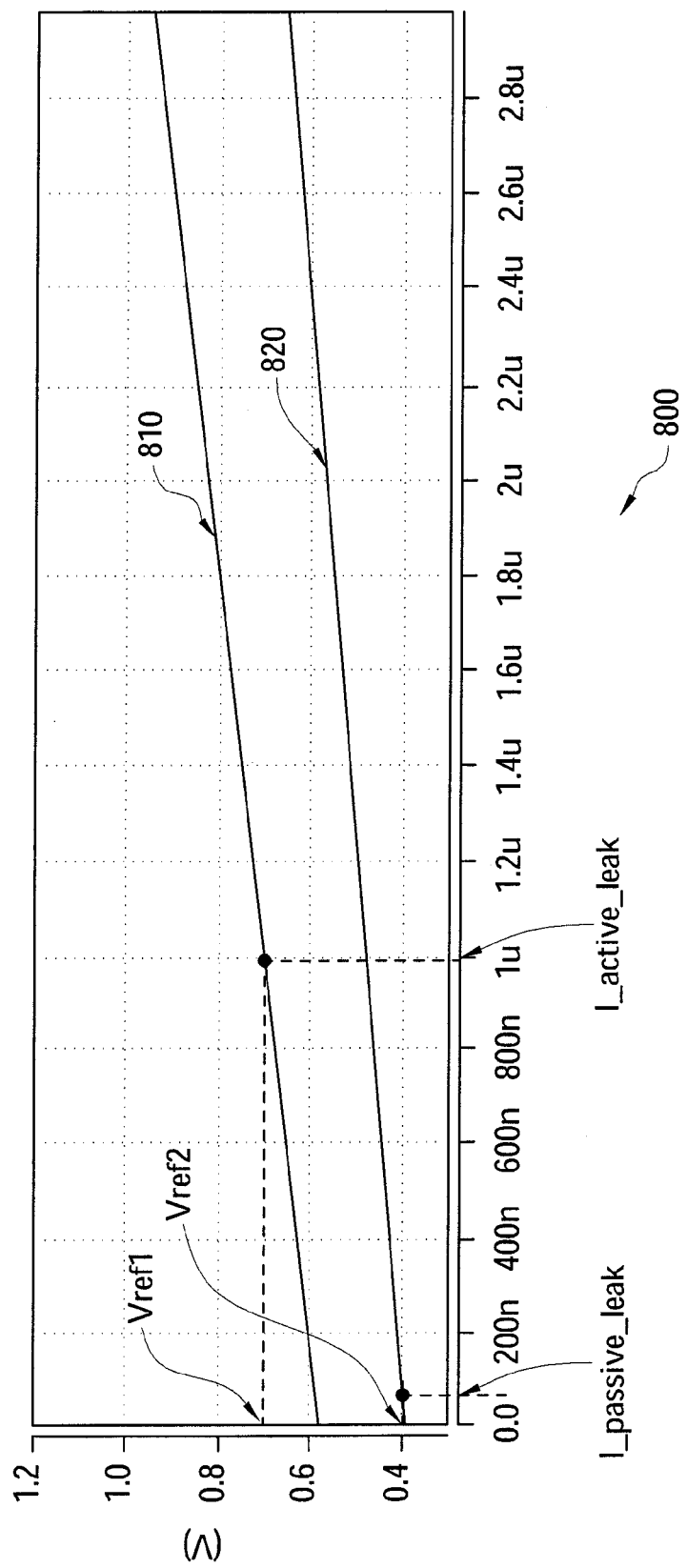
FIG. 8 is a graph of waveforms illustrating the relationship between various signals, in accordance with some embodiments.

Resistors R1, R2 and R3 serve as voltage dividers for voltage Vsup to generate voltage Vref1 and Vref2, which are selected as illustrated in FIG. 8.

Comparator 710 compares voltage Vref1 with signal O220 to generate signal O710, which has a value of 0 or 1 (e.g., low or high). In some embodiments, if signal O220 is less than voltage Vref1, then signal O710 is high. But if signal O220 is greater than voltage Vref1, then signal O710 is low.

Similarly, comparator 720 compares voltage Vref2 with signal O230 to generate signal O710, which also has a value of 0 or 1.

Digital decoding network 730 receives signals O710 and O720 to generate trim bits tbcrtl. In some embodiments, the relationship between signals O220 and O230, through digital decoding network 730, is provided by following table

| O710 | O720 | btcrtl[1:0] |
|------|------|-------------|
| 0    | 0    | 01          |
| 0    | 1    | 10          |
| 1    | 0    | 10          |
| 1    | 1    | 11          |

As a result, the relationship between signals O710, O720, btcrtl[1:0], and current source I0, I1, and I2 are as follows:

| O710 | O720 | tbcrtl[1:0] | Current source for current Ikeeper |
|------|------|-------------|------------------------------------|
| 0    | 0    | 01          | I0                                 |
| 0    | 1    | 10          | I0 + I1                            |
| 1    | 0    | 10          | I0 + I1                            |
| 1    | 1    | 11          | I0 + I1 + I2                       |

Based on the above table, if current Ikeeper is within the range of I_passive_leak and I_active_leak (e.g., current SIkeeper is greater than current I_passive_leak and lesser than current I_active_leak) current Ikeeper remains at the default value of I0+I1 (e.g., trim bit trcrtl[1:0] remain at 10). But if current SIkeeper is greater than current I_active_leak, trim bits tbcrtl change to 01 so that current Ikeeper is reduced to current I0, and if current SIkeeper is less than current I_passive_leak, trim bits tbcrtl change to 11 so that current Ikeeper is increased to current I0+I1+I2.

In some embodiments, voltages Vref1 and Vref2 are set such that they respectively correspond to the point where Ikeeper<Icell_on/N1 and Ikeeper>127*Icell_off*N2.

Waveforms to acquire voltages Vref1 and Vref2

FIG. 8 is a graph of waveforms 800 illustrating how to select the values of voltages Vref1 and Vref2 in accordance with some embodiments. The X-axis is in the current unit (e.g., nA, μA, etc.) while the Y-axis is in the voltage unit (e.g., V).

Line 810 shows the relationship between current I_active_leak and voltage Vref1. Once the value of current I_active_leak is available, the value of voltage Vref1 is acquired based on line 810. For example, for a value of about 1 μA for current I_active_leak, voltage Vref1 is about 0.68V. In some embodiments, line 810 is acquired through simulation data.

In some embodiments, two points (I_active_leak, Vref1) are acquired to generate line 810. Initially, current I_active_leak is kept at a first chosen value (e.g., 2 μA), current Ikeeper is swept in a range (e.g., from 1 nA to 10 μA). HSPICE software simulation is run to get a curve of signal O220 versus current Ikeeper from 1 nA to 10 μA (e.g., curve1). On curve1 where current Ikeeper is at the set value of current I_active_leak (e.g., 2 μA), the corresponding value O220 is selected as a first point for voltage Vref1. Current I_active_leak is then kept at a second value (e.g., 1.2 μA), current Ikeeper is swept in a second (e.g., the same) range from 1 nA to 10 μA. HSPICE software simulation is run to get another curve of signal O220 versus current Ikeeper from 1 nA to 10 μA (e.g., curve2). On curve2, where current Ikeeper is at the set value of current I_active_leak (e.g., 1.2 μA), the corresponding value O220 is selected as a second point for voltage Vref1. Based on the two acquired points for voltage Vref1, line 810 is generated.

Similarly, line 820 shows the relationship between current I_passive_leak and voltage Vref2. Once the value of current I_passive_leak is available, the value of voltage Vref2 is acquired based on line 820. For example, for a value of about 80 nA for current I_passive_leak, voltage Vref2 is about 0.4V. In some embodiments, line 820 is acquired through simulation data in the same manner as line 810 is acquired.

If S810 and S820 represent the slope of the respective lines 810 and 820, N1B and N2B represent the design base lines for the respective design margin factors N1 and N2, in some embodiments, $$O220 = Vref1 + S810*(1/N1 - 1/N1B)$$

$$O230 = Vref2 + S820*(N2 - N2B)$$

Illustrative Method

Figure 9:
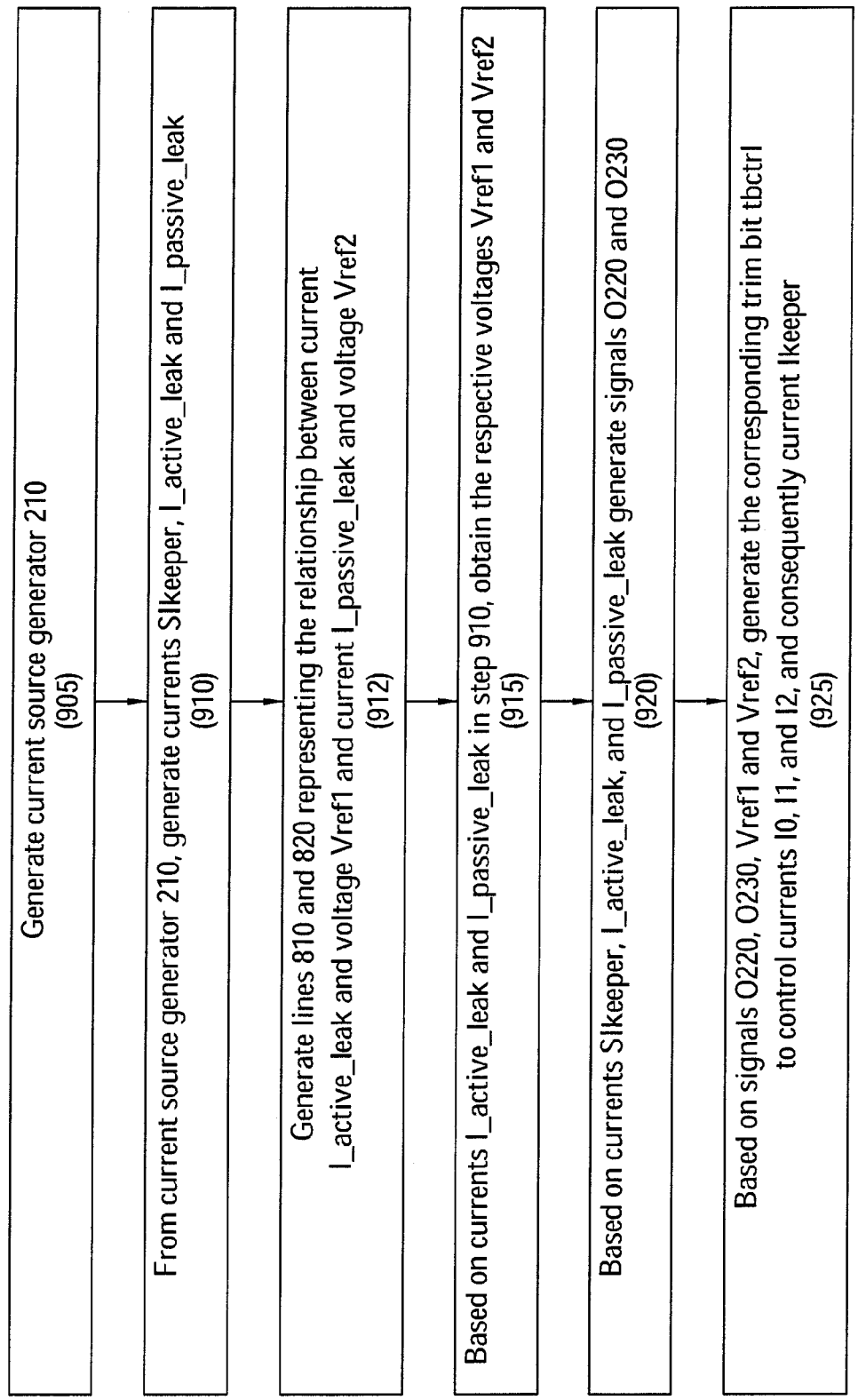
FIG. 9 is a flowchart of illustrating controlling the keeper current in the logic circuit of FIG. 2, in accordance with some embodiments.

FIG. 9 is a flowchart illustrating a method to control current Ikeeper, in accordance with some embodiments.

In step 905, current source generator 210 is created that includes circuits 500A, 500B, and 500C.

In step 910, based on circuits 500A, 500B, and 500C, currents SIkeeper, I_active_leak, and I_passive_leak are generated.

In step 912, lines 810 and 820 are determined, representing the relationship between current I_active_leak and voltage Vref1 and current I_passive_leak and voltage Vref2.

In step 915, reference voltages Vref1 and Vref2 are obtained using waveforms 800 based on currents I_active_leak and I_passive_leak in step 910.

In step 920, using currents SIkeeper, I_active_leak, I_passive_leak, comparators 220 and 230, signals O220 and O230 are generated.

In step 925, based on signals Vref1, Vref2, O220, and O230, trim bits tbcrtl[1:0] are generated based on which currents I0, I1, and I2 and thus current Ikeeper are controlled.

Detailed Schematic of Circuit 220

Figure 10:
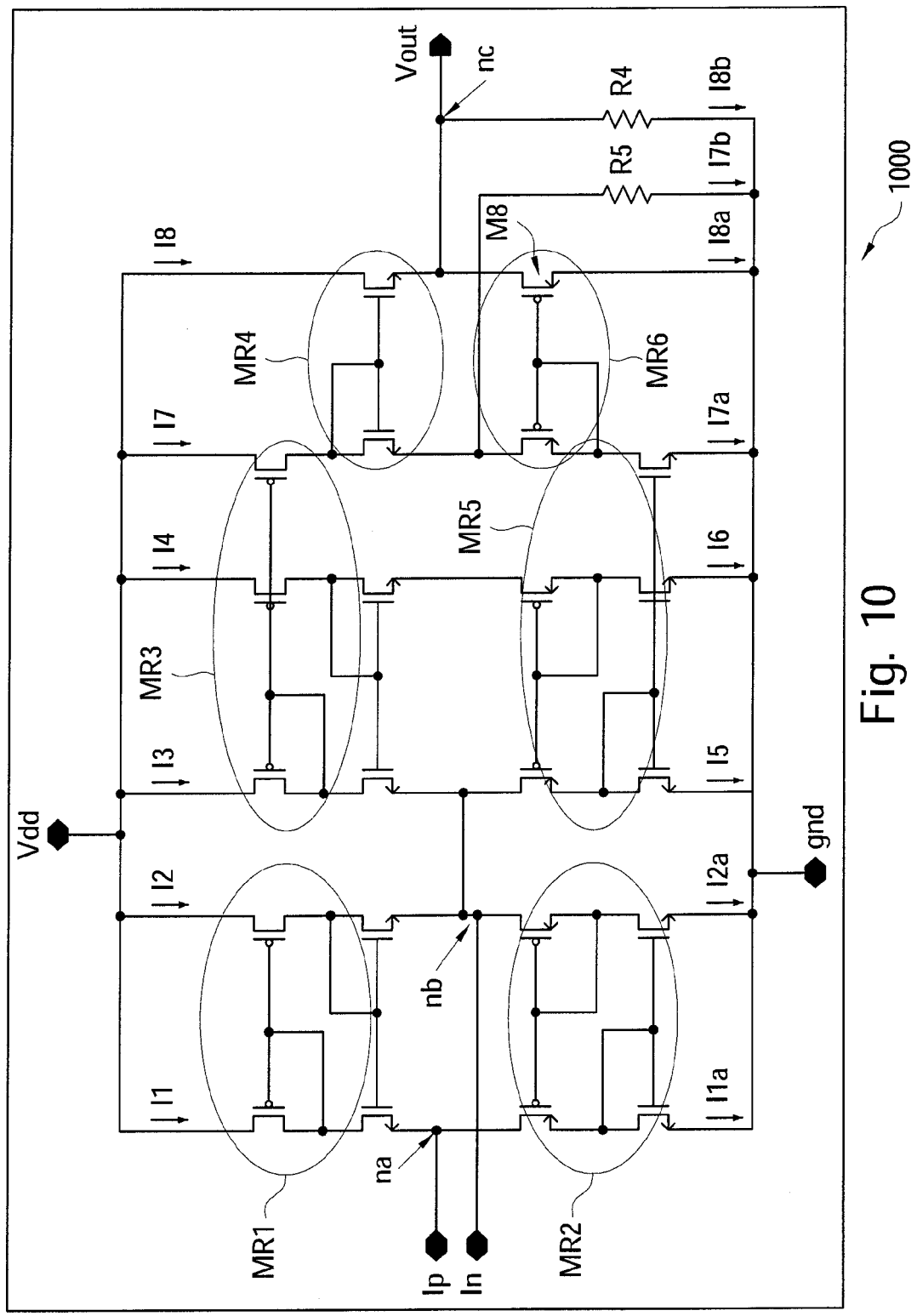
FIG. 10 is a detailed schematic diagram of circuit 220, in accordance with some embodiments.

FIG. 10 is a detailed schematic diagram 1000 of circuit 220, in accordance with some embodiments. Input currents Ip and In correspond to currents SIkeeper and I_active_leak in FIG. 2, respectively. Voltage Vout corresponds to signal O220 in FIG. 2. Current mirrors MR1, MR2, MR3, MR4, MR5, and MR6 are configured as shown. Currents I1, I2, I1a, I2a, I3, I4, I5, I6, I7, I7a, I7b, I8, I8a, and I8b flow through corresponding transistors and resistors. Resistor R4 represents the loading resistance for circuit 220 and serves as a current path for current I8b, which is the difference between currents I8 and I8a. In some embodiments, currents I3 and I5 are configured such that $$I3 - I5 = Ip - In$$

Stated differently, current I3 is larger than current I5 by the value of Ip−In. Further, current I3 is mirrored to currents I4, I7, and I8 while current I5 is mirrored to currents I6, I7a, and I8a. The branches for currents I4 through current I6 and current I7 through current I7a are the replica for the branch of current I3 through current I5.

Mathematically, at node na, $$Ip + I1 = I1a$$

At node nb, $$I2 + I3 + In = I2a + I5$$

However,

I1=I2 through current mirror MR1

I1a=I2a through current mirror MR2

I3=I4=I7 through current mirror MR3

I7=I8 through current mirror MR4

I5=I6=I7a through current mirror MR5

I7a=I8a through current mirror MR6

Based on the above relationship $$Ip = I1a - I1$$

$$In = I2a + I5 - I2 - I3$$

$$Ip - In = I1a - I1 - I2a - I5 + I2 + I3$$

$$= I3 - I5$$

$$= I7 - I7a$$

$$= I8 - I8a$$

At node nc $$Vout = I8b*R1$$

When the resistance of transistor M8 (e.g., Rm8) is configured much greater than resistance R1

$$Vout = (I8 - I8a)*R4$$

$$= (Ip - In)*R4$$

A number of embodiments have been described. It will nevertheless be understood that various modifications may be made without departing from the spirit and scope of the invention. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., low or high) of the various signals used in the above description is also for illustration purposes, embodiments are not limited to a particular level when a signal is activated and/or deactivated, but, rather, selecting such a level is a matter of design choice. Current source generator 210 is shown as part of current control circuit 140, but, in some embodiments, current source generator 210 is an independent circuit outside of current control circuit 140. The various figures show the resistor circuits using discrete resistors for illustration only, equivalent circuitry may be used. For example, a resistive device, circuitry or network (e.g., a combination of resistors, resistive devices, circuitry, etc.) can be used in place of the resistor. The above method embodiments show exemplary steps, but they are not necessarily performed in the order shown. Steps may be added, replaced, changed order, and/or eliminated as appropriate, in accordance with the spirit and scope of disclosed embodiments.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A circuit comprising:

a current source network configured to generate a first current;

a leakage circuit having a first leakage current and a second leakage current representing at least two leakage conditions, the first leakage current and the second leakage current affecting the flow of the first current;

a current source generator configured to generate
 a similar first current corresponding to the first current;
 a similar first leakage current corresponding to the first leakage current in a first leakage condition;
 a similar second leakage current corresponding to the second leakage current in a second leakage condition; and a current control circuit configured to provide a current control signal controlling the first current based on the similar first current, the similar first leakage current, and the similar second leakage current.

2. The circuit of claim 1, wherein
the leakage circuit includes a plurality of transistors coupled to a data line;
and the current source generator includes:
 a first transistor corresponding to a transistor of the plurality of transistors and configured to generate the similar first leakage current; and
 a second transistor corresponding to a transistor of the plurality of transistors configured to generate the similar second leakage current.

3. The circuit of claim 2, wherein the plurality of transistors, the first transistor, and the second transistor are NMOS transistors.

4. The circuit of claim 2, wherein the first leakage current is based on an operation state of the first transistor and the second leakage current is based on an operation state of the second transistor, and wherein the operation state of the first transistor differs from the operation state of the second transistor.

5. The circuit of claim 2, wherein
Ikeeper represents the first current;
I_cell_on represents a current flow when the first transistor is on;
Icell_off represents a leakage current when the second transistor is off;
N1 and N2 are leakage factors used for design margins and N represents a number of the plurality of transistors minus 1; and
Ikeeper is controlled such that $Ikeeper < Icell\_on/N1$ and $Ikeeper > Icell\_off*N*N2$.

6. The circuit of claim 1, wherein
the current source network includes a first circuitry configured to generate the first current;
the current source generator includes a second circuitry configured to generate the similar first current.

7. The circuit of claim 6, wherein
the first circuitry includes a first pair of PMOS transistors having their sources coupled together; and
the second circuitry includes a second pair of PMOS transistors having their sources coupled together, wherein a transistor of the first pair of PMOS transistors corresponds to a transistor of the second pair of PMOS transistors.

8. The circuit of claim 6, wherein
the first circuitry includes a first pair of PMOS transistors having their sources coupled together; and
the second circuitry includes a PMOS transistor having a size greater than a size of a PMOS transistor of the first pair of PMOS transistors and configured to generate the similar first current.

9. The circuit of claim 1, wherein the current source generator includes a plurality of current sources based on which the current source generator is configured to generate the first current.

10. The circuit of claim 1, wherein
the first current is configured to have a plurality of current flows; and
the current control signal includes a plurality of states, wherein a state of the plurality of states corresponding to a current flow of the plurality of current flows.

11. The circuit of claim 1, wherein
the current source network and the leakage circuit are part of a memory array; and
the leakage circuit includes memory cells storing data for the memory array.

12. The circuit of claim 1, wherein the current control circuit comprises:
 a first comparator configured to compare the similar first current with the similar first leakage current to generate a first compare-result signal;
 a second comparator configured to compare the similar first current with the similar second leakage current to generate a second compare-result signal;
 a third comparator configured to compare the first compare-result signal with a first reference voltage to generate a third compare-result signal;
 a fourth comparator configured to compare the second compare-result signal with a second reference voltage to generate a fourth compare-result signal; and
 a decoding circuit configured to receive the third compare-result signal and the fourth compare-result signal to generate a state of the current control signal corresponding to a current flow of the first current.

13. The circuit of claim 12, wherein the first reference voltage is derived from the first similar leakage current and the second reference voltage is derived from the second similar leakage current.

14. The circuit of claim 1, wherein the current control circuit configured to provide the current control signal is further based on one or a combination of the following relationships $Ikeeper < I\_active\_leak/N1$ and $Ikeeper > I\_passive\_leak*N2$, wherein Ikeeper represents the first current; I_active_leak represents the first leakage current in the first leakage condition; I_passive_leak represents the second leakage current in the second leakage condition; and N1 and N2 are design margin factors.

15. In a circuit having a current source network with a plurality of current sources configured to provide a first current and a leakage circuit having at least a first leakage current in a first leakage condition and a second leakage current in a second leakage condition, a method comprising:
 generating a similar first current corresponding to the first current;
 generating a similar first leakage current corresponding to the first leakage current;
 generating a similar second leakage current corresponding to the second leakage current;
 based on a first relationship between the similar first current and the similar first leakage current, and a second relationship between the similar first current and the similar second leakage current, generating a state of a signal corresponding to at least one current source of the plurality of current sources configured to provide the first current.

16. The method of claim 15, further comprising:
generating a first relationship signal based on the first relationship;
generating a second relationship signal based on the second relationship; and
generating the state of the signal based on the first relationship signal and the second relationship signal.

17. The method of claim 16, further comprising:
generating a first reference voltage based on the first leakage current or the first similar leakage current;
generating a second reference voltage based on the second leakage current or the second similar leakage current;
based on a third relationship between the first relationship signal and the first reference voltage, generating a third relationship signal;
based on a fourth relationship between the second relationship signal and the second reference voltage, generating a fourth relationship signal; and
based on the third relationship signal and the fourth relationship signal, generating the state of the signal.

18. A circuit comprising:
a current source network generating a first current;
a leakage circuit coupled to the current source network and configured to generate a first leakage current in a first leakage condition and a second leakage current in a second leakage condition;
a current source generator configured to generate a similar first current corresponding to the first current, a similar first leakage current corresponding to the first leakage current, and a similar second leakage current corresponding to the second leakage current;
first means configured to compare the similar first current with the similar first leakage current to generate a first means result;
second means configured to compare the similar first current with the similar second leakage current to generate a second means result;
third means configured to compare the first means result with a first reference voltage to generate a third means result;
fourth means configured to compare the second means result with a second reference voltage to generate a fourth means result; and
a decoding circuit configured to receive the third means result and the fourth means result and generate a signal to control the first current.

19. The circuit of claim 18, wherein one or a combination of the first means and the second means includes:
a first input configured to receive a first input current represented by Ip;
a second input configured to receive a second input current represented by In;
an output configured to generate an output voltage represented by Vout;
a first branch having a first current represented by I3 and a second current represented by I5,
wherein Ip−In =I3−I5, Vout=(I3−I5)*R1; and R1 represents a resistance load for the first means or the second means.

20. The circuit of claim 19, wherein one or a combination of the first means and the second means further includes: a first current mirror mirroring current I3 to a third current represented by I4, a second mirror mirroring current I3 to a fourth current represented by I7, a third current mirror mirroring current I3 to a fifth current represented by I8, a fourth current mirror mirroring current I5 to a sixth current represented by I6, a fifth current mirror mirroring current I5 to a seventh current represented by I7a, a sixth current mirror mirroring current I5 to an eighth current represented by I8a, wherein current I4 and current I6 being on a second branch, current I7 and I7a being on a third branch, and wherein the first branch, the second branch, and the third branch are different from one another.

* * * * *